(12) United States Patent
Zeng et al.

(10) Patent No.: US 9,525,155 B2
(45) Date of Patent: Dec. 20, 2016

(54) GAS AND MOISTURE PERMEATION BARRIERS

(71) Applicant: CHEIL INDUSTRIES, INC., Uiwang-si, Gyeonggi-do (KR)

(72) Inventors: Xianghui Zeng, Albany, CA (US); Lorenza Moro, San Carlos, CA (US); Damien Boesch, San Jose, CA (US)

(73) Assignee: Samsung SDI Co., Ltd., Yongin-si (KR)

( * ) Notice: Subject to any disclaimer, the term of this patent is extended or adjusted under 35 U.S.C. 154(b) by 241 days.

(21) Appl. No.: 14/073,809

(22) Filed: Nov. 6, 2013

(65) Prior Publication Data

US 2014/0151656 A1    Jun. 5, 2014

Related U.S. Application Data

(60) Provisional application No. 61/732,847, filed on Dec. 3, 2012.

(51) Int. Cl.
| | | |
|---|---|---|
| *H01L 21/00* | (2006.01) | |
| *H01L 51/52* | (2006.01) | |
| *H01L 51/00* | (2006.01) | |
| *C23C 14/00* | (2006.01) | |
| *C23C 14/08* | (2006.01) | |

(Continued)

(52) U.S. Cl.
CPC .......... *H01L 51/5253* (2013.01); *C23C 14/00* (2013.01); *C23C 14/081* (2013.01); *C23C 16/403* (2013.01); *C23C 16/45525* (2013.01); *H01L 51/0096* (2013.01); *Y02E 10/549* (2013.01); *Y10T 428/31504* (2015.04)

(58) Field of Classification Search
CPC ... H01L 51/5253; H01L 51/0096; C23C 14/00
See application file for complete search history.

(56) References Cited

U.S. PATENT DOCUMENTS

| | | | |
|---|---|---|---|
| 7,781,031 B2* | 8/2010 | Breitung | H01L 51/5253 427/248.1 |
| 2013/0011646 A1 | 1/2013 | Hwang et al. | |

FOREIGN PATENT DOCUMENTS

KR    10-2011-0063384 A    6/2011

OTHER PUBLICATIONS

Smith, Richard W., et al., *Void formation during film growth: A molecular dynamics simulation study*, Department of Materials Science and Engineering, The University of Michigan, Ann Arbor, Michigan 48109-2136, J. Appl. Phys. 70 (3), Feb. 1, 1996, 1448-1457.

(Continued)

*Primary Examiner* — Laura Menz
(74) *Attorney, Agent, or Firm* — Lewis Roca Rothgerber Christie LLP

(57) ABSTRACT

A gas and moisture permeation barrier stack deposited by both sputtering and atomic layer deposition techniques. In one embodiment, the barrier stack comprises a bottom barrier layer deposited on a substrate by sputtering and a top barrier layer deposited on the sputtered layer by atomic layer deposition. In one embodiment, the sputtered barrier layer has a water vapor transmission rate of about $10^{-5}$ gm/m²·day or lower, and the top barrier layer improves the water vapor transmission rate of the resulting two-layer barrier stack to about $10^{-6}$ gm/m²·day or lower.

24 Claims, 18 Drawing Sheets

(51) Int. Cl.
C23C 16/40 (2006.01)
C23C 16/455 (2006.01)

(56) References Cited

OTHER PUBLICATIONS

Yamada, Y., et al., *The Properties of a New Transparent and Colorless Barrier Film*, Toyobo Research Institute, Japan, 38th Annual Technical Conference Proceedings (1995), 28-31.

Choi, B.I., et al., *Ultralow Water Vapor Permeation Measurement Using Tritium for OLED Displays*, Journal of the Korean Physical Society, vol. 53, No. 4, Oct. 2008, pp. 2179-2184.

Fabes, B. D. et al., *Porosity and composition effects in sol-gel derived interference filters*, Department of Materials Science and Engineering, University of Arizona, Tucson AZ, Elsevier, Thin Solid Films 254 (1995) 175-180.

Jerman, Martin, *Refractive index of thin films of $SiO_2$, $ZrO_2$, and $HfO_2$ as a function of the films' mass density*, Applied Optics / vol. 44, No. 15 / May 20, 2005, 3006-3012.

Mergel, D., *Modeling thin $TiO_2$ films of various densities as an effective optical medium*, Elsevier, Thin Solid Films 397 (2001), 216-222.

Mergel, D., *Density and refractive index of $TiO_2$ films prepared by reactive evaporation*, Elsevier, Thin Solid Films 371 (2000) 218-224.

Nisato, Giovanni et al., *P-88 Thin Film Encapsulation for OLEDs: Evaluation of Multi-layer Barriers using the Ca Test*, Philips Research, Prof. Holstlaan 4, 5656 AA Eindhoven, The Netherlands, SID 03 Digest, 550-553.

Nisato, G., et al., *Evaluating High Performance Diffusion Barriers: the Calcium Test*, Philips Research, Prof. Holstlaan 4, 5656 AA Eindhoven, the Netherlands, 4, pages.

KIPO Office action dated Dec. 1, 2015 in corresponding KR application No. 10-2013-0146636, with English translation, 4 pages.

* cited by examiner

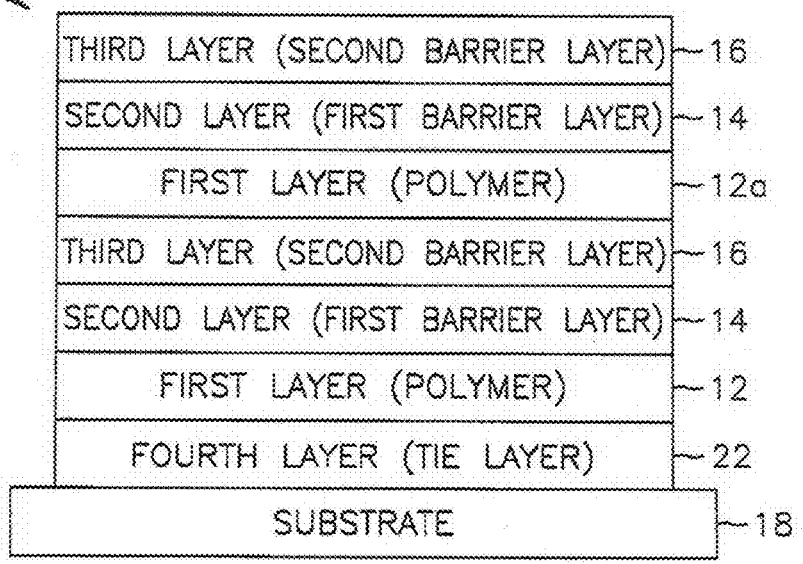

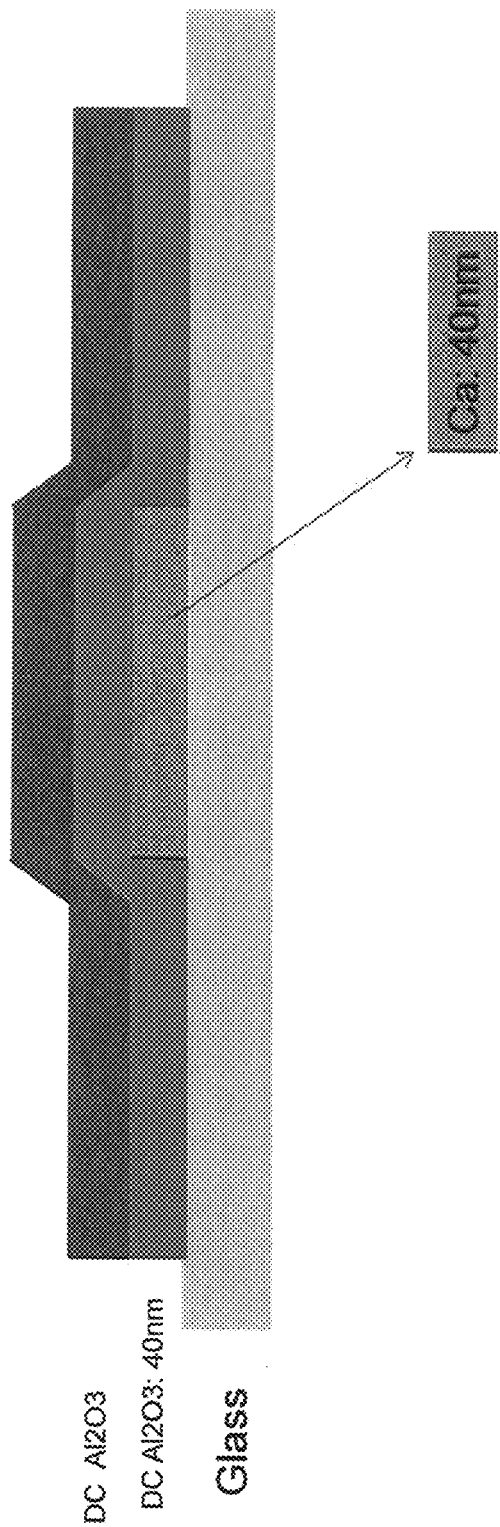

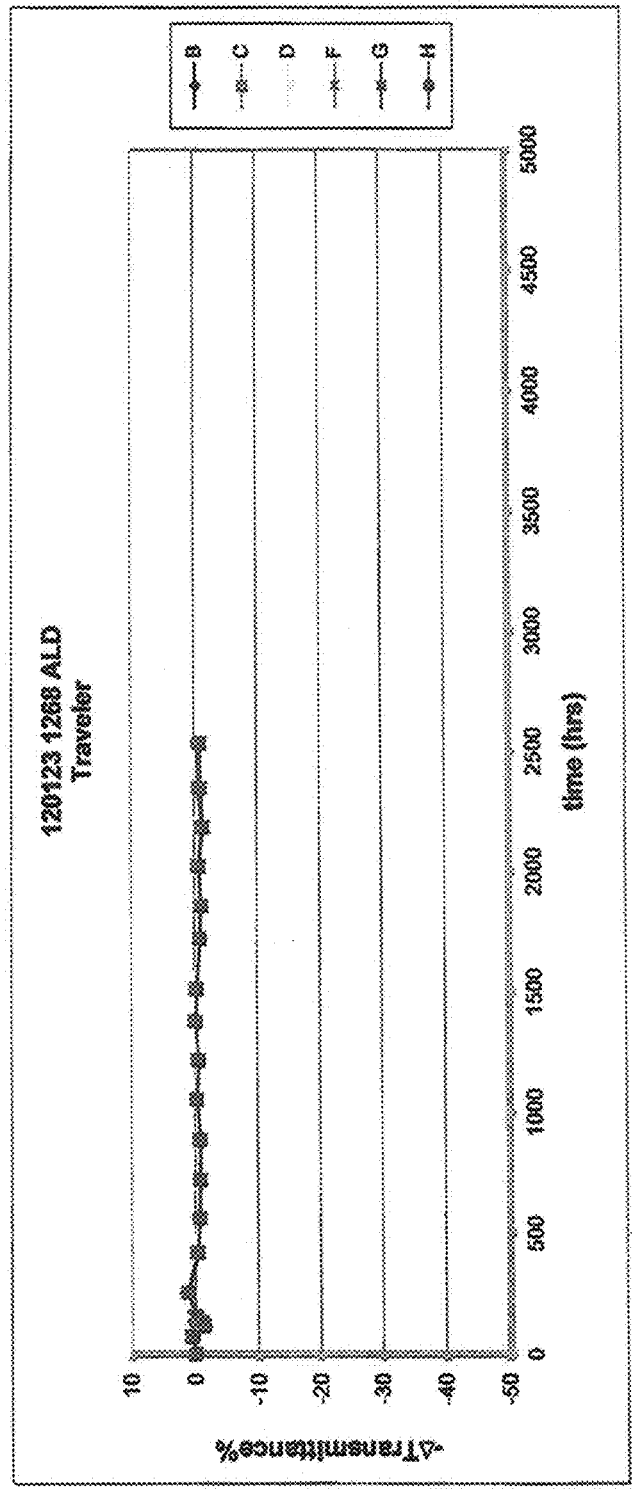
FIG. 5B

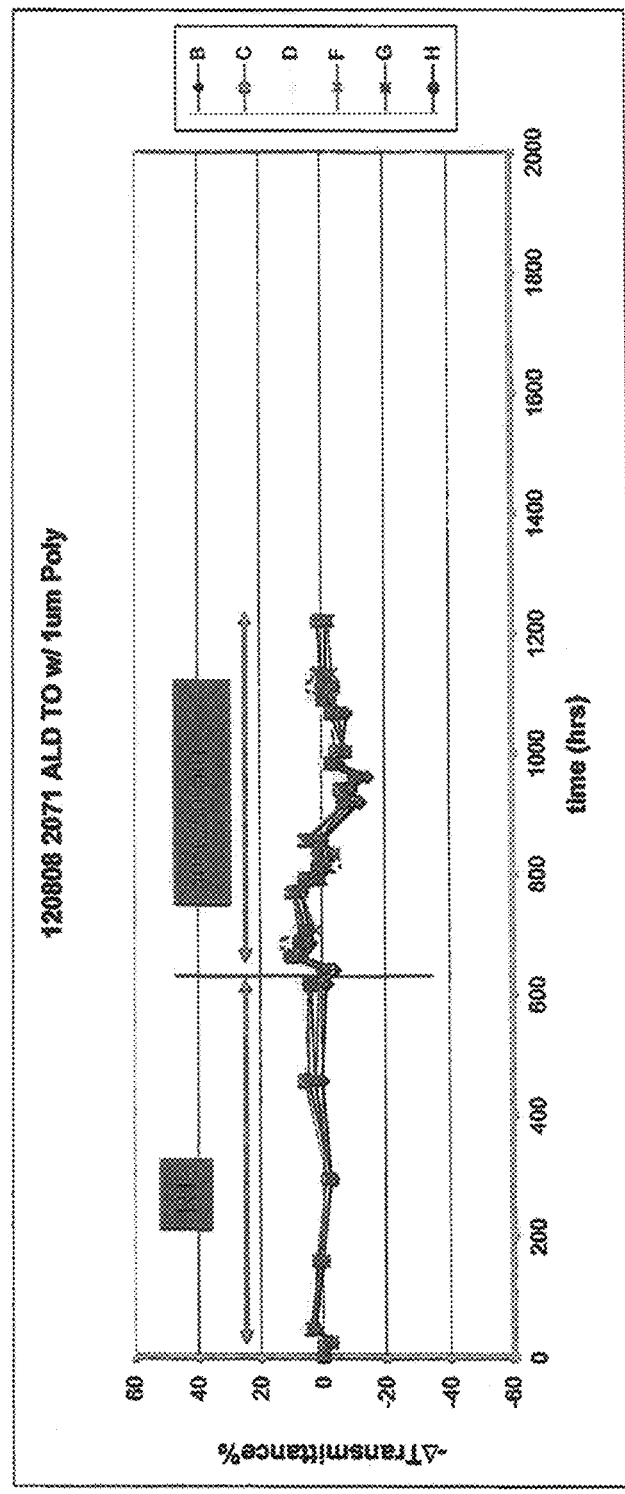
FIG. 7D

GAS AND MOISTURE PERMEATION BARRIERS

CROSS-REFERENCE TO RELATED APPLICATION

This application claims priority to and the benefit of U.S. Provisional Application No. 61/732,847, filed Dec. 3, 2012, titled "Gas Permeation Barrier," the entire contents of which are incorporated herein by reference.

TECHNICAL FIELD

The present disclosure is related to barrier layers and barrier stacks for protecting devices from the permeation of moisture and gases, to devices encapsulated by the barrier stacks, and to methods of making the barrier layers and barrier stacks.

INTRODUCTION

Many devices, such as organic light emitting devices and the like, are susceptible to degradation from the permeation of certain gases, such as water vapor and oxygen present in the environment, or that may be introduced during the manufacture, handling or storage of the product. To reduce permeability to these damaging gases, the devices are typically coated with a barrier coating or are encapsulated by incorporating a barrier stack adjacent one or both sides of the device.

Barrier coatings typically include a single layer of inorganic material, such as aluminum, silicon or aluminum oxides, or silicon nitrides. However, for many devices, such a single layer barrier coating does not sufficiently reduce or prevent oxygen or water vapor permeability. Indeed, in organic light emitting devices, for example, which require exceedingly low oxygen and water vapor transmission rates, these single layer barrier coatings do not adequately reduce or prevent the permeability of damaging gases. The inadequacy of the protection is sometimes due to the technique used to deposit the barrier coatings. Barrier coatings can be deposited using several different techniques, including chemical vapor deposition, plasma enhanced chemical vapor deposition, sputtering and atomic layer deposition. However, each of these techniques has its own unique disadvantages. For instance, sputtering typically creates layers with surface defects (such as pinholes and particles) that affect the performance of the layer. Defects can also be present in the bulk of the layer. Additionally, chemical vapor deposition, plasma enhanced chemical vapor deposition, and atomic layer deposition often produce layers with impurities and low densities, especially when the layers are deposited at lower temperatures. These impurities are caused by the failure of some of the precursors to react properly during the deposition process, and this lack of reaction is exacerbated by the use of lower deposition temperatures. As the deposition of barrier layers on organic light emitting devices requires lower temperatures (i.e., the devices can typically only withstand temperatures of about 100° C. or lower), barrier layers deposited by these techniques can have amounts of impurities that adversely affect barrier layer performance.

SUMMARY OF THE INVENTION

Briefly, one embodiment, of the invention comprises a composite article protected against degradation from the permeation of moisture and gases. The article comprises a substrate, and a two-layer barrier stack for protecting the surface of the substrate. The barrier stack comprises a first barrier layer on the surface of the substrate, and a second barrier layer formed on a surface of the first barrier layer opposite from the substrate. The first barrier layer is formed by sputtering, and the second barrier layer is formed by atomic layer deposition. The first barrier layer has a water vapor transmission rate of about $10^{-5}$ gm/m$^2$·day or lower, and the two-layer barrier stack has a water vapor transmission rate of about $10^{-6}$ gm/m$^2$·day or lower.

Another embodiment of the invention comprises a method for protecting a substrate from the permeation of moisture and gases, which includes sputtering a first barrier layer on a substrate, wherein the sputtered first barrier layer has a water vapor transmission rate of about $10^{-5}$ gm/m$^2$·day or lower; and depositing a second barrier layer on the first barrier layer by atomic layer deposition, wherein the resulting barrier stack has a water vapor transmission rate of about $10^{-6}$ gm/m$^2$·day or less.

The first and second barrier layers can be applied to a surface of the substrate as a barrier stack either by direct deposition to the substrate or by a lamination method. In one embodiment, the second barrier layer forms an outer surface of the protective barrier stack. In another embodiment, the first barrier layer is formed by AC or DC pulsing techniques.

A further embodiment comprises a multilayer barrier stack for protecting a substrate subject to degradation from the permeation of moisture and gases. The multilayer barrier stack comprises a first two-layer barrier stack having a first barrier layer formed by sputtering, and a second barrier layer deposited on the first barrier layer by atomic layer deposition. The multilayer barrier stack also includes a second two-layer barrier stack having a third barrier layer formed by sputtering, and a fourth barrier layer deposited on the third barrier layer by atomic layer deposition. In one embodiment, the two two-layer barrier stacks are separated by a resinous planarization layer positioned between them.

BRIEF DESCRIPTION OF THE DRAWINGS

FIG. 4 is a cross-sectional diagram showing a further embodiment of the invention in the form of a multi-layer barrier including more than one two-layer barrier coatings.

FIG. 5A illustrates a typical calcium test sample and glass substrate used in comparative tests of the barrier layers. FIGS. 5B and 5C are a first set of test slides showing results of Comparative Example 1 in which both barrier layers are deposited by sputtering.

FIGS. 7B and 7D are graphs showing data from two test samples: one at room temperature and one at an elevated temperature.

DETAILED DESCRIPTION

Figure 1:
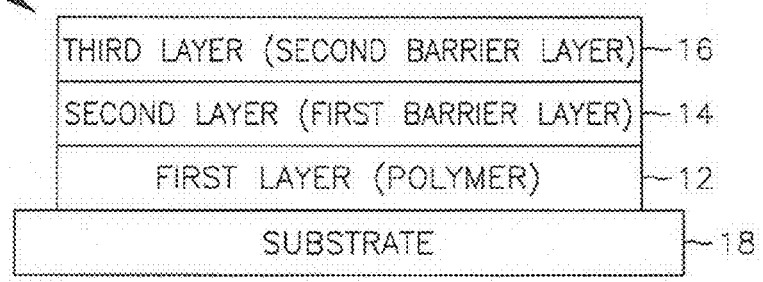
FIG. 1 is a cross-sectional diagram showing a first embodiment of a gas permeable barrier stack, according to principles of this invention, deposited on a substrate.

In embodiments of the present invention, a two-layer barrier coating includes a first barrier layer deposited by sputtering, and a second barrier layer deposited by atomic layer deposition (ALD). The second barrier layer is a conformal coating covering the first barrier layer, the second barrier layer being thick enough to correct surface defects present on the surface of the first barrier layer, but thin enough to both avoid cracking on flexible substrates and reduce cost. The two-layer barrier coating can be directly deposited on a device to be protected by the two-layer coating, or may be deposited on a separate substrate or temporary support, and then laminated on the device by transfer techniques. Also, the two-layer barrier coating may be deposited on the substrate on which the device to be encapsulated is fabricated. Such a substrate may include transparent plastic foils or opaque plastic foils.

The first barrier layer includes an inorganic material, and serves as a barrier layer, reducing or preventing the permeation of harmful gases to the underlying encapsulated device. The first barrier has a level of quality with few defects and a low water vapor transmission rate (WVTR). The first barrier layer may be deposited directly on the device to be protected or on a functional layer on the device, or may be deposited on a separate substrate or support. Deposition of the first barrier layer may vary depending on the material used for the first barrier layer. For example, an inorganic material (e.g., an oxide) may be deposited as the first barrier layer by sputtering (e.g. AC or DC sputtering which may be continuous or pulsed).

For layers deposited by sputtering (whether AC or DC, pulsed or continuous), the sputtering conditions may vary depending on the material being deposited, and on the gas used to effect the sputtering. Those of ordinary skill in the art would be able to determine the proper sputtering conditions and select an appropriate gas for the sputtering in order to achieve a suitable first barrier layer. Specifically, in order to provide an adequate barrier to the permeation of harmful gases, the first barrier layer should have an appropriate thickness, density and refractive index to meet transmission requirements. As is known to those of ordinary skill in the art, density is related to refractive index. See, e.g., Smith, et al., "Void formation during film growth: A molecular dynamics simulation study," J. Appl. Phys., 79 (3), pgs. 1448-1457 (1996); Fabes, et al., "Porosity and composition effects in sol-gel derived interference filters," Thin Solid Films, 254 (1995), pgs. 175-180; Jerman, et al., "Refractive index of this films of SiO2, ZrO2, and HfO2 as a function of the films' mass density," Applied Optics, vol. 44, no. 15, pgs. 3006-3012 (2005); Mergel, et al., "Density and refractive index of TiO2 films prepared by reactive evaporation," Thin Solid Films, 3171 (2000) 218-224; and Mergel, D., "Modeling TiO2 films of various densities as an effective optical medium," Thin Solid Films, 397 (2001) 216-222.

The entire contents of all of these publications are incorporated herein by reference. Also, the correlation between film density and barrier properties is described, e.g., in Yamada, et al., "The Properties of a New Transparent and Colorless Barrier Film," Society of Vacuum Coaters, 505/856-7188, 38th Annual Technical Conference Proceedings (1995) ISSN 0737-5921, the entire contents of which are incorporated herein by reference.

Although the first barrier layer is described as being deposited by sputtering, it is understood that any deposition technique that can deposit a first barrier layer having the appropriate density/refractive index and layer thickness can be used. Such a first barrier layer should have a density/refractive index that is sufficient to prevent or substantially reduce permeation of harmful gases. To that end, in some embodiments of the present invention, the refractive index of the first barrier layer may be about 1.6 to about 1.7. As would be understood by those of ordinary skill in the art, the refractive index (and therefore, density) of the first barrier layer will depend on the deposited material, e.g., the atomic number of the metal in the metal oxide. For example, layers including certain oxides (such as, for example aluminum oxide, i.e., $Al_2O_3$) may have a refractive index of about 1.6 to about 1.7, while layers of other oxides may have a refractive index of about 1.4 to about 1.6. As discussed above, refractive index and density are related, and those of ordinary skill in the art would understand how to calculate film density from these refractive indices.

Figure 9:
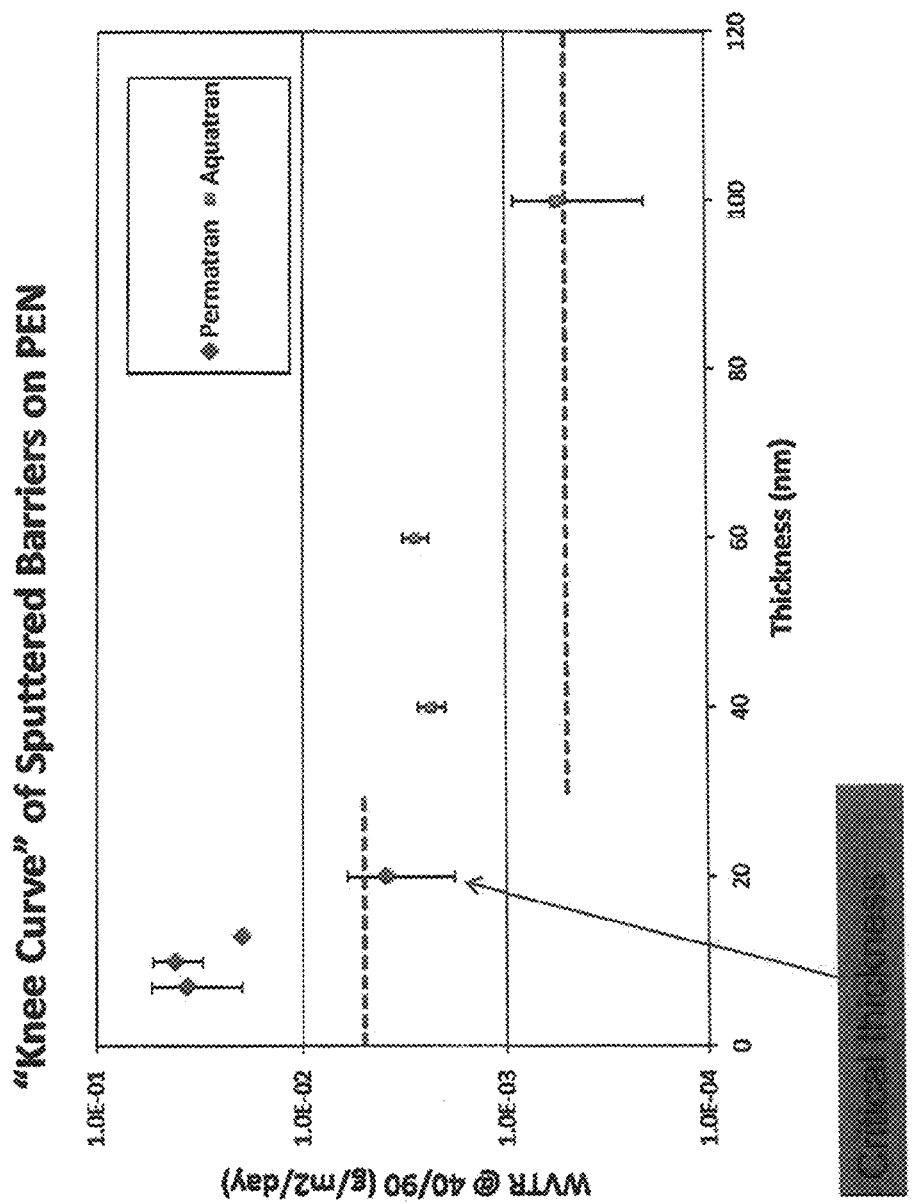
FIG. 9 is a graph showing the critical thickness of a sputtered barrier layer in providing a stable water vapor transmission rate.

The performance of the deposited first barrier layer as a barrier is also related to the thickness of the layer, which can be any thickness so long as the layer has the above-described refractive index and/or density. In some embodiments, however, the thickness of the first barrier layer is about 20 nm to about 100 nm, for example, about 20 to about 60 nm, or about 20 to about 50 nm. In some exemplary embodiments, for example, the thickness of the first barrier layer is about 50 nm. (The data shown in Example 9 and in FIG. 9 show tests that can be conducted to determine a critical film thickness.)

The sputtering conditions for depositing the first barrier layer are not particularly limited so long as the conditions are suitable for generating a first barrier layer having the properties described above (e.g., the appropriate refractive index, density and thickness). Indeed, as would be understood by those of ordinary skill in the art, the sputtering conditions will generally vary depending on the size of the target and the distance between the target and the substrate. Also, those of ordinary skill in the art would be able to devise sputtering conditions suitable to generate a first barrier layer having the desired properties (e.g., the above-described refractive index, density and thickness). In some exemplary embodiments, however, the sputtering conditions can include a power of about 2 to about 6 kW, for example about 3.2 to about 4.8 kW, a pressure of about 1 to about 5 mTorr, for example about 2.5 mTorr, a target voltage of about 150 to about 400 V, for example about 290V, a gas flow rate of about 50 to about 80 sccm, for example about 65 sccm, and a track speed of about 50 to about 85 cm/min depending on the condition of the sputtering target, for example 70 to 85 cm/min or 64 cm/min. Also, although the inert gas used in the sputtering process can be any suitable inert gas (such as helium, xenon, krypton, etc.), in some embodiments, the inert gas is argon (Ar).

The material of the first barrier layer is not particularly limited, and may be any material suitable for preventing or reducing permeation of gases to the underlying device or substrate. Indeed, the material of the first barrier layer may be the same as the material of the second barrier layer, or may be a different material. Some nonlimiting examples of suitable materials for the first barrier layer include metals, metal oxides, metal nitrides, metal oxynitrides, metal carbides, metal oxyborides, and combinations thereof. Those of ordinary skill in the art would be capable of selecting a suitable metal for use in the oxides, nitrides and oxynitrides based on the desired optical properties of the layer. However, in some embodiments, for example, the metal may be Al, Zr or Ti. Si based materials (i.e., silicon oxides, nitrides or oxynitrides) may also be used, but may not be preferable. In addition to metal materials, semiconductor materials may also be used as the material of the first barrier layer, but some semiconductor materials may not be preferable. In some embodiments, the material of the first barrier layer is a metal oxide, e.g., aluminum oxide.

The second barrier layer is deposited on the first barrier layer, and conformally coats the first barrier layer. In some embodiments, the second barrier layer is thinner than the first barrier layer. The second barrier layer is deposited by atomic layer deposition on the first barrier layer, and is a thin layer, as described below. Although the second barrier layer is described as deposited by atomic layer deposition, any deposition technique and deposition conditions can be used to deposit the second barrier layer so long as the second barrier layer is deposited in such a manner as to yield a thin, conformal amorphous coating on the first barrier layer. Specifically, the second barrier layer should be thick enough to correct the surface defects in the first barrier layer, but thin enough to avoid cracking due to stress.

The atomic layer deposition offers the advantage of enabling the deposition of a thin, conformal coating on the first barrier layer. The conditions of the atomic layer deposition are not particularly limited, and as would be understood by those of ordinary skill in the art, the conditions will vary depending on the material to be deposited as the second barrier layer, and on the precursor materials used to make the barrier layer material. In some exemplary embodiments, however, the atomic layer deposition conditions include a substrate temperature of about 85° C. to about 110° C., a purging time of about 5 seconds to about 20 seconds, a precursor pulse of about 0.3 to about 0.7 seconds, a suitable carrier gas, and a process vacuum of about 80 mTorr to about 1000 mTorr. Also, the atomic layer deposition may use an inert gas as a purge gas, and any suitable inert gas (such as helium, xenon, krypton, etc.) can be used. In some embodiments, the atomic layer deposition conditions include a substrate temperature of about 90° C., a purging time of about 10 seconds, a precursor pulse of about 0.4 seconds, a nitrogen carrier gas, and a process vacuum of about 100 mTorr. Also, the atomic layer deposition may use an inert gas as a purge gas, and any suitable inert gas (such as helium, xenon, krypton, etc.) can be used. However, in some embodiments, the inert purge gas is argon (Ar).

The precursors used in the ALD process to deposit the second barrier layer will vary depending on the material of the second barrier layer. Selection of appropriate precursor materials is within the level of skill of those of ordinary skill in the art. For example, those of ordinary skill in the art would be capable of selecting a proper metal source (as reactant), and a proper oxidant to achieve the desired metal oxide for deposition via ALD to form the second barrier layer. Some nonlimiting examples of suitable oxidants for the ALD process (or a plasma enhanced ALD process, which can also be used to deposit the second barrier layer) include water vapor, ozone ($O_3$) and $O_2$ plasma. Suitable reactants will depend on the material to be deposited as the second barrier layer, as discussed above. However, to form an aluminum oxide (i.e., $Al_2O_3$) layer as the second barrier layer, one nonlimiting example of a suitable reactant for the ALD process is trimethylaluminum.

The material of the second barrier layer is not particularly limited, and may be any material suitable for aiding the first barrier layer to substantially prevent or reduce the permeation of damaging gases (e.g., oxygen and water vapor) to the encapsulated device. Indeed, the material of the second barrier layer may be the same as the material of the first barrier layer (described above), or may be a different material. Some nonlimiting examples of suitable materials for the second barrier layer include metals, metal oxides, metal nitrides, metal oxynitrides, metal carbides, and combinations thereof. Those of ordinary skill in the art would be capable of selecting a suitable metal for use in the oxides, nitrides and oxynitrides based on the desired properties of the second barrier layer. However, in some embodiments, for example, the metal may be Al, Zr, Si or Ti.

Also, while the second barrier layer may include the same material as the first barrier layer, the second barrier layer can be thinner than the first barrier layer, and may have a different density and/or refractive index than the first barrier layer due to the different techniques (e.g., sputtering vs. atomic layer deposition) used to deposit the layers. For example, in some embodiments, the density of the first barrier layer is greater than the density of the second barrier layer. However, the present invention is not limited to this circumstance, and in other exemplary embodiments, the density of the second barrier layer may be greater than the density of the first barrier layer. While the density and refractive index of the second barrier layer is not particularly limited and will vary depending on the material of the layer, in some exemplary embodiments, the second barrier layer has a refractive index of about 1.60 to about 1.64. As discussed above, those of ordinary skill in the art would be able to calculate the density of the layer from the refractive index information. The thickness of the second barrier layer is also not particularly limited, so long is the second barrier layer is thick enough to correct surface defects in the first barrier layer, and thin enough to avoid cracking due to stress. The second barrier layer according to embodiments of this invention survives such stress cracking under test conditions in which the test sample is repetitively flexed 10,000 times with a flex radius of 1 cm. In some exemplary embodiments, the thickness of the second barrier layer is about 50 nm or thinner, for example about 20 nm to about 50 nm. In some embodiments, for example, the thickness of the second barrier layer is about 25 nm to about 50 nm.

The second barrier layer is substantially uniform and continuous and is conformal with the first barrier layer. The second barrier layer also has good adhesion to the first barrier layer.

The two-layer barrier coatings according to embodiments of the present invention achieve superior barrier performance, for the resulting barrier stack. For example, the two-layer barrier coatings according to embodiments of the present invention can achieve water vapor transmission rates that are significantly better than two-layer barrier coatings in which both layers are deposited by sputtering. Specifically, the two-layer barrier coatings according to embodiments of the present invention can achieve barrier stack water vapor transmission rates of about $10^{-6}$ gm/m²·day or lower, for example, on the order of $10^{-7}$ gm/m²·day. In one embodiment, the WVTR data are measured at 40° C./90% RH and reported for room temperature (about 20° C.) and 50% RH conditions after correction related at the aceleration factor between the two conditions.

The superior barrier performance can be achieved by initially forming the first barrier layer by sputtering techniques that yield a high quality barrier coating having a high density with minimal physical defects such as pinholes or particles. In one embodiment, the sputtered barrier layer made according to the previously described conditions (refractive index/density, thickness) and material can achieve a high quality characterized by the barrier coating having a water vapor transmission rate on the order of $10^{-5}$ gm/m$^2$·day or lower, prior to coating on the second barrier layer. And when adding the second barrier layer by ALD techniques, the water vapor transmission rate of the overall two-layer barrier stack can improve. In one embodiment the barrier stack can achieve improved water vapor transmission rates of about $10^{-6}$ gm/m$^2$·day or lower.

The high quality sputtered barrier layer referred to previously can be achieved, in one embodiment, by a barrier layer having a refractive index of about 1.6 or greater, and a layer thickness of about 20 to about 100 nm, with a metal oxide such as aluminum oxide as the sputtered material.

The resulting water vapor transmission rate for the overall barrier stack can be improved upon with the addition of the ALD layer having a refractive index of about 1.60-1.64 and a layer thickness of about 20-50 nm. As described previously, the ALD layer can be deposited at a substrate temperature greater than 85° C. while maintaining its stability and achieving an improved water vapor transmission rate of the overall barrier stack on the order of $10^{-7}$ gm/m$^2$·day or lower.

In embodiments of the present invention, a barrier stack includes the two-layer barrier coating discussed above, and a decoupling (or smoothing/planarization) layer. The layers of the barrier stack can be directly deposited on a device to be encapsulated (or protected) by the barrier stack, or may be deposited on a separate substrate or support, and then laminated on the device. Also, the barrier stack may be deposited on the substrate on which the device to be encapsulated is fabricated. Such a substrate may include transparent plastic foils or opaque plastic foils.

The planarization/smoothing layer of the barrier stack includes a polymer or other organic material that serves as a planarization, decoupling and/or smoothing layer. Specifically, the planarization/smoothing layer decreases surface roughness, and encapsulates surface defects, such as pits, scratches, and digs, thereby creating a planarized surface that is ideal for the subsequent deposition of additional layers. As used herein, the terms "planarization/smoothing," "smoothing layer," "decoupling layer," and "planarization layer" are used interchangeably, and all terms refer to the same layer, as now defined. The planarization layer can be deposited directly on the device to be encapsulated (e.g., an organic light emitting device), or may be deposited on a separate support. The planarization layer may be deposited on the device or substrate by any suitable deposition technique, some nonlimiting examples of which include vacuum processes and atmospheric processes. Some nonlimiting examples of suitable vacuum processes for deposition of the planarization layer include flash evaporation with in situ polymerization under vacuum, and plasma deposition and polymerization. Some nonlimiting examples of suitable atmospheric processes for deposition of the planarization layer include spin coating, ink jet printing, screen printing and spraying.

The planarization layer can include any suitable material capable of acting as a planarization, decoupling and/or smoothing layer. Some nonlimiting examples of suitable such materials include organic polymers, inorganic polymers, organometallic polymers, hybrid organic/inorganic polymer systems, and silicates. In some embodiments, for example, the material of the planarization layer may be an acrylate-containing polymer, an alkylacrylate-containing polymer (including but not limited to methacrylate-containing polymers), or a silicon-based polymer.

The planarization layer can have any suitable thickness such that the layer has a substantially planar and/or smooth layer surface. As used herein, the term "substantially" is used as a term of approximation and not as a term of degree, and is intended to account for normal variations and deviations in the measurement or assessment of the planar or smooth characteristic of the first layer. In some embodiments, for example, the first layer has a thickness of about 100 to 1000 nm.

Figure 2:
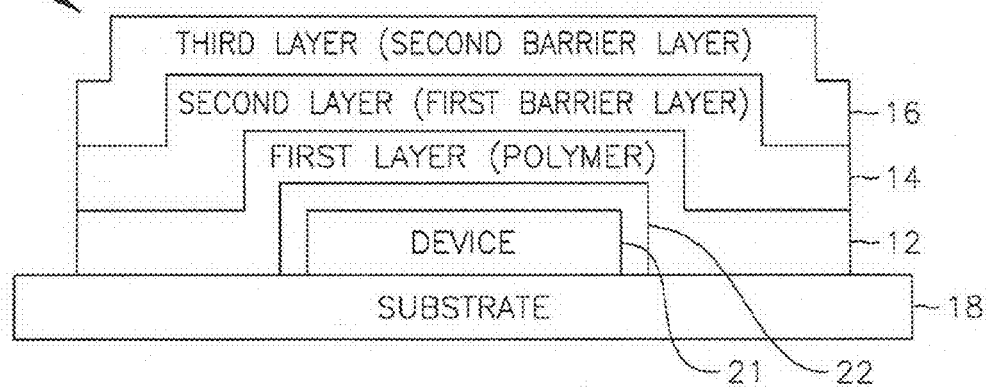
FIG. 2 is a cross-sectional diagram showing a second embodiment of the barrier stack similar to FIG. 1 deposited on a device to be encapsulated.

Exemplary embodiments of a barrier stack according to the present invention are illustrated in FIGS. 1 through 4. The barrier stack 10 depicted in FIG. 1 includes a first layer 12 which includes a polymer, a second layer 14 which includes the first barrier layer described above, and a third layer 16 which includes the second barrier layer described above. In FIG. 1, the barrier stack is deposited on a substrate 18, for example glass. In FIG. 2, the barrier stack 20 is deposited on the device 21, e.g., an organic light emitting device. The barrier stack can be deposited directly on the device 21, or alternatively, the barrier stack can be applied with an intervening tie layer 22.

In addition to the first, second and third layers, some exemplary embodiments of the barrier stack can include a fourth layer 22 between the first layer 12 and the substrate 18 or the device 20 to be encapsulated. Although the inventive barrier stacks are discussed herein and depicted in the attached drawings as including first, second, third and fourth layers, it is understood that these layers may be deposited on the substrate or the device in any order, and the identification of the layers as a first layer, second layer, third layer, or fourth layer does not mean that the layers must be deposited in that order. Indeed, as discussed here, and depicted in the embodiment of FIG. 3, the fourth layer 22 is deposited on the substrate or device prior to deposition of the first layer. In addition, embodiments of the invention referred to as a "barrier stack" may be characterized as a "two-layer barrier stack" where the combination comprises the first and second barrier coatings along with the polymer layer and/or the tie layer.

The fourth layer 22 acts as a tie layer, improving adhesion between the layers of the barrier stack and the substrate 18 or the device 21 to be encapsulated. The material of the fourth layer is not particularly limited, and can include the materials described above with respect to the second and third layers (i.e., the first and second barrier layers). Also, the material of the fourth layer may be the same as or different from the material of either the second layer or the third layer (i.e., the first or second barrier layers). The materials of the second and third layers (i.e., the first and second barrier layers) are described in detail above.

Additionally, the fourth layer 22 may be deposited on the substrate 18 or the device 20 to be encapsulated by any suitable technique, including, but not limited to the techniques described above with respect to the second and third layers (i.e., the first and second barrier layers). In some embodiments, for example, the fourth layer may be deposited by sputtering (AC or DC, pulsed or continuous) under the conditions described above with respect to the first barrier layer. Also, the thickness of the deposited fourth layer is not particularly limited, and can be any thickness suitable to effect good adhesion between the first layer of the barrier stack and the substrate or device to be encapsulated. In some embodiments, for example, the fourth (tie) layer can have a thickness of about 20 nm to about 60 nm, for example, about 40 nm.

Figure 3:
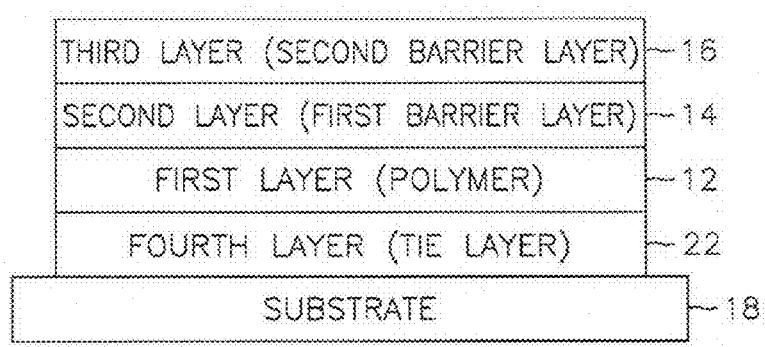
FIG. 3 is a cross-sectional diagram showing a third embodiment of the barrier stack similar to FIG. 1 but which includes a tie layer between the layers of the barrier stack and a substrate.

An exemplary embodiment of a barrier stack according to the present invention including a fourth layer 22 is depicted in FIG. 3. The barrier stack depicted in FIG. 3 includes the first layer 12 which includes a polymer, the fourth layer 22 which includes an oxide tie layer, the second layer 14 which includes the first barrier layer described above, and the third layer 16 which includes the second barrier layer described above. In FIG. 3, the barrier stack is deposited on a substrate 18, for example glass. However, it is understood that the barrier stack can alternatively be deposited directly on the device, e.g., an organic light emitting device, as depicted in FIG. 2 with respect to the embodiments excluding the fourth layer.

In some embodiments of the present invention, a method of making a barrier stack includes providing a substrate, which may be a separate substrate support or may be a device for encapsulation by the barrier stack (e.g., an organic light emitting device or the like). The method further includes forming a first layer on the substrate. The first layer is as described above and acts as a decoupling/smoothing/planarization layer. As also discussed above, the first layer may be deposited on the device or substrate by any suitable deposition technique, including, but not limited to, vacuum processes and atmospheric processes. Some nonlimiting examples of suitable vacuum processes for deposition of the first layer include flash evaporation with in situ polymerization under vacuum, and plasma deposition and polymerization. Some nonlimiting examples of suitable atmospheric processes for deposition of the first layer include spin coating, ink jet printing, screen printing and spraying.

The method further includes depositing a second layer on the surface of the first layer. The second layer is the first barrier layer as described above and serves to substantially prevent or substantially reduce the permeation of damaging gases to the underlying device. The deposition of the second layer (i.e., the first barrier layer) may depend on the material of the second layer, as discussed above. For example, the material of the second layer may be an inorganic material (e.g., an oxide) that is deposited by sputtering (AC or DC, pulsed or continuous). These methods are described in more detail above. Also, any deposition technique may be used as long as the deposited layer has the appropriate refractive index/density and thickness, as described above.

The method further includes depositing a third layer on the surface of the second layer. The third layer is the second barrier layer as described above and serves to correct defects in the second layer (i.e., the first barrier layer) and to aid in the substantial prevention or substantial reduction in the permeation of damaging gases to the underlying device. The deposition of the third layer (i.e., the second barrier layer) may vary depending on the material used for the third layer. However, in general, any deposition technique and any deposition conditions can be used to deposit the third layer (i.e., the second barrier layer) so long as the third layer is deposited in such a manner as to conformally coat the second layer (i.e., the first barrier layer) in a thin layer that corrects surface defects in the second layer (i.e., the first barrier layer) while maintaining a thickness sufficiently thin to avoid cracking due to stress. As mentioned, the third layer may be deposited by atomic layer deposition. While any suitable conditions for deposition can be employed, some suitable conditions are described above.

In some embodiments, the method further includes depositing a fourth layer between the substrate (or the device to be encapsulated) and the first layer (i.e., the planarization/smoothing/decoupling layer). The fourth layer is as described above and acts as a tie layer for improving adhesion between the substrate or device and the first layer (i.e., the planarization/smoothing/decoupling layer) of the barrier stack. The fourth layer may be deposited by any suitable technique, as discussed above. For example, as also discussed above, the fourth layer may be deposited on the substrate (or the device to be encapsulated) by any suitable technique. In some embodiments, for example, the fourth layer is deposited by sputtering (AC or DC, pulsed or continuous, for example), as discussed above.

According to some embodiments, the barrier stack may be a multi-layer stack 24 including more than one two-layer barrier coating as shown in FIG. 4. In such embodiments, additional first layers 12a (i.e., planarization/smoothing/decoupling layers) may be positioned between adjacent two-layer barrier coatings 14, 16. For example, a barrier stack according to embodiments of the present invention may include at least two two-layer barrier coatings, and an additional first layer 12a (i.e., planarization/smoothing/decoupling layer) may be positioned between the two two-layer barrier coatings 14, 16.

The Examples described below are provided for illustrative purposes only, and do not limit the present disclosure. In the Examples, the effectiveness of the two-layer barrier coatings described above were evaluated against two-layer barrier coatings in which both layers were deposited using the same technique.

EXAMPLE 1

A two-layer barrier was deposited on a calcium test sample set on a glass substrate. FIG. 5A illustrates a typical calcium test sample and glass substrate. A first barrier layer was deposited on the calcium test sample and glass substrate by pulsed DC sputtering aluminum oxide using a G200 coater from SNU Precision (South Korea). The pulsed DC sputtering conditions included 2 passes at a power of 3.2 kW, a pressure of 2.5 mTorr, an Argon flow rate of 65 sccm, a target voltage of 290 V. The track speed for deposition was 64 cm/min, but may vary depending on the condition of the sputtering target. The deposited layer had a thickness of 50 nm.

A second barrier layer was deposited on the first barrier layer by atomic layer deposition using TMA (trimethylaluminum) and water. The atomic layer deposition conditions included a substrate temperature of 90° C., high purity nitrogen gas as the carrier gas, a purging time of 10 seconds, a precursor pulse of 0.4 seconds, and a process vacuum of 100 mTorr. The deposited layer had a thickness of 25 nm.

EXAMPLE 2

A barrier stack was prepared as in Example 1, except that the first barrier layer was deposited to a thickness of 40 nm with a track speed in the range of 70 to 85 cm/min depending on the condition of the sputtering target. Additionally, the second barrier layer was deposited to a thickness of 50 nm.

EXAMPLE 3

A barrier stack was prepared as in Example 1, except that a polymer layer was deposited on the second barrier layer.

EXAMPLE 4

A barrier stack was prepared as in Example 1, except that an aluminum oxide tie layer was deposited on the calcium test sample, and a polymer decoupling layer was deposited on the oxide tie layer. The first and second barrier layers were then deposited on the polymer decoupling layer, and a second polymer layer was deposited on the second barrier layer.

EXAMPLE 5

A barrier stack was prepared as in Example 1, except that the first barrier layer was deposited to a thickness of 41 nm, and the second barrier layer was deposited to a thickness of 47 nm. Also, the substrate was PEN (poly(ethylene naphthalenedicarboxylate)).

EXAMPLE 6

A barrier stack was prepared as in Example 1, except that the first barrier layer was deposited to a thickness of 40 nm, and the barriers second layer was deposited to a thickness of 23 nm. Also, the substrate was PEN (poly(ethylene naphthalenedicarboxylate)).

EXAMPLE 7

A barrier stack was prepared as in Example 1, except that the first barrier layer was deposited to a thickness of 42 nm, and the second barrier layer was deposited to a thickness of 23 nm. Also, the substrate was PEN (poly(ethylene naphthalenedicarboxylate)).

COMPARATIVE EXAMPLE 1

A two-layer barrier was deposited on a calcium test sample set on a glass substrate. A first barrier layer was deposited on the calcium test sample and glass substrate by pulsed DC sputtering aluminum oxide. The DC sputtering conditions included 2 passes at a power of 3.2 kW, a pressure of 2.5 mTorr, an Argon flow rate of 65 sccm, a target voltage of 290 V, and a track speed in the range of 70 to 85 cm/min depending on the condition of the sputtering target. The deposited layer had a thickness of 40 nm.

A second barrier layer was deposited on the first barrier layer by pulsed DC sputtering aluminum oxide. The DC sputtering conditions included 2 passes at a power of 3.2 kW, a pressure of 2.5 mTorr, an Argon flow rate of 65 sccm, a target voltage of 290 V. The track speed for deposition was 64 cm/min track speed, but may vary depending on the condition of the sputtering target. The deposited layer had a thickness of 50 nm.

COMPARATIVE EXAMPLE 2

A barrier stack was prepared as in Comparative Example 1, except that the first barrier layer had a thickness of 45 nm, and the second barrier layer had a thickness of 30 nm. Also, an aluminum oxide tie layer was deposited on the calcium test sample, and a polymer decoupling layer was deposited on the oxide tie layer. The first and second barrier layers were then deposited on the polymer decoupling layer, and a second polymer layer was deposited on the second barrier layer.

COMPARATIVE EXAMPLE 3

A barrier stack was prepared as in Example 1, except that the first barrier layer was not deposited, and the second barrier layer was deposited to a thickness of 45 nm. Also, the substrate was Si.

Figure 5C:
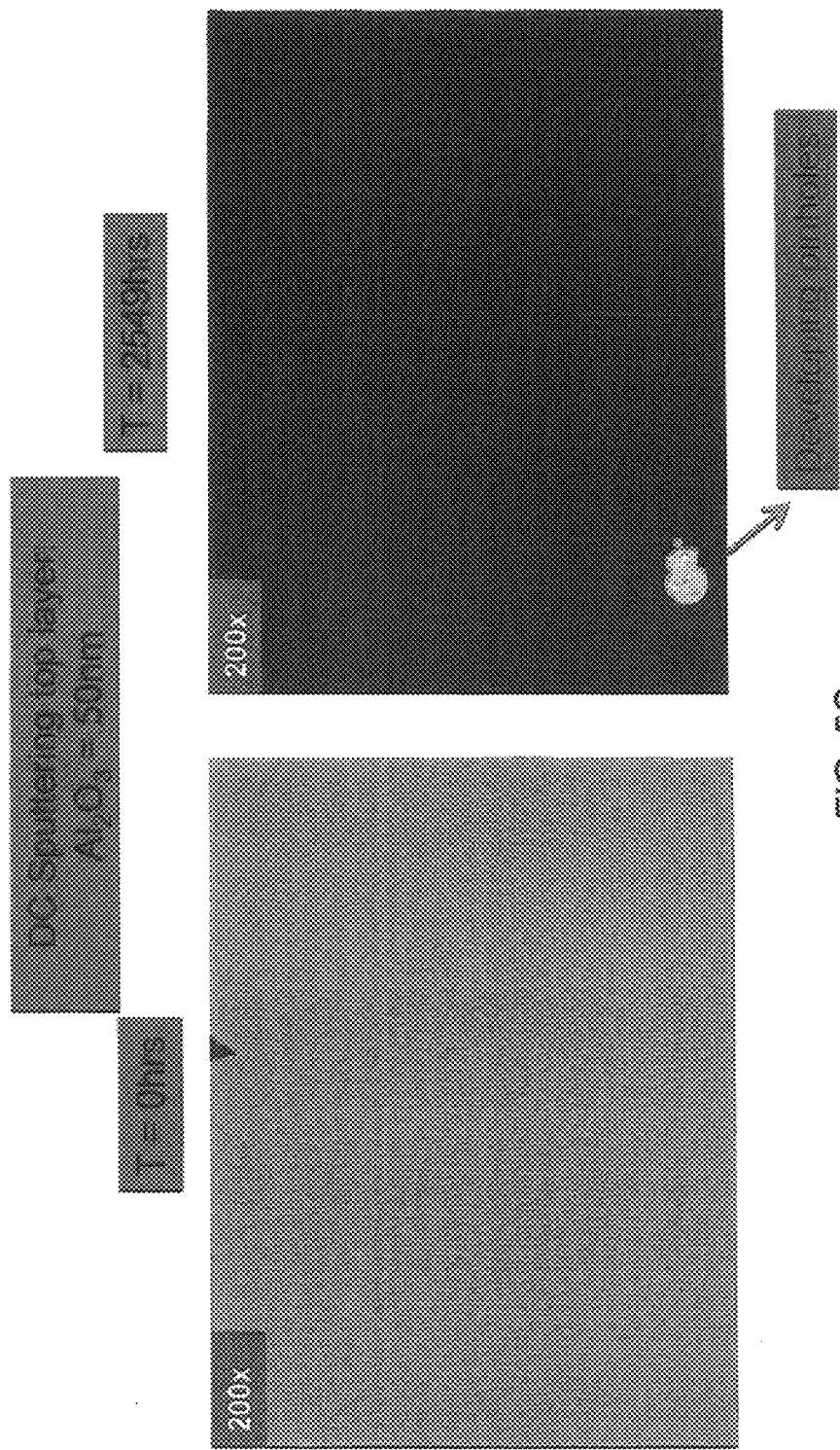
Figure 6A:
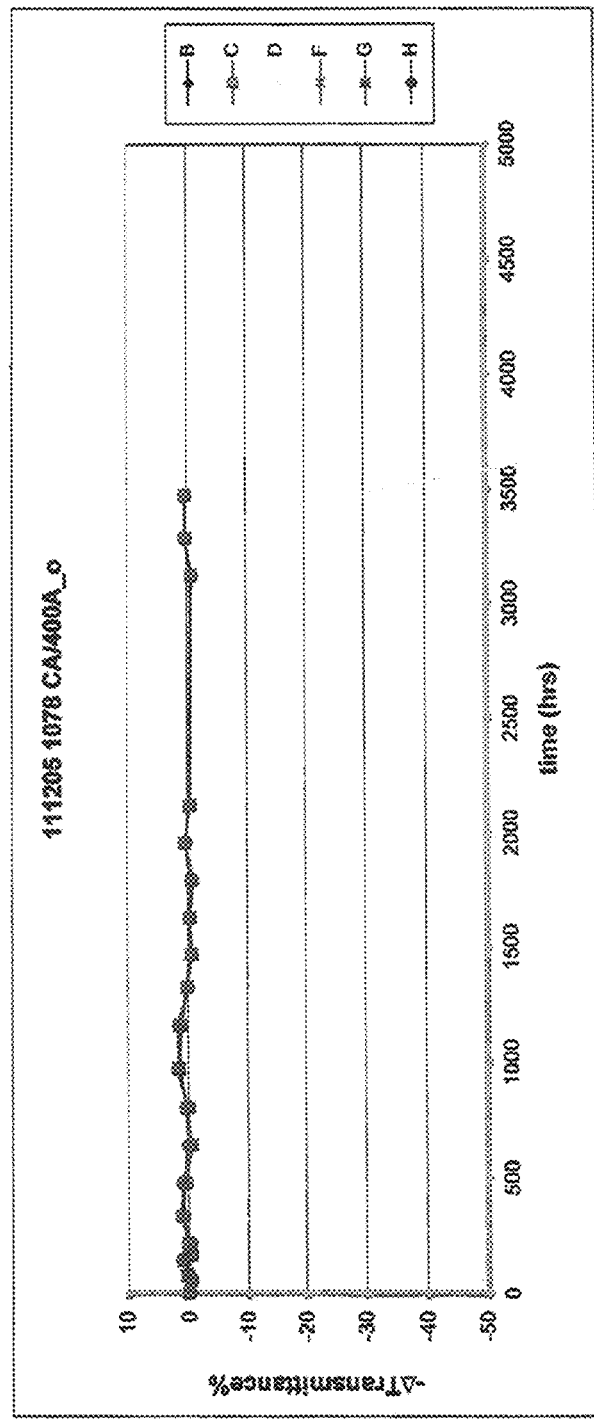
FIGS. 6A and 6B are a second set of test slides showing results of Comparative Example 1 in which the first barrier layer is deposited by sputtering and the second barrier layer is deposited by atomic layer deposition.
Figure 6B:
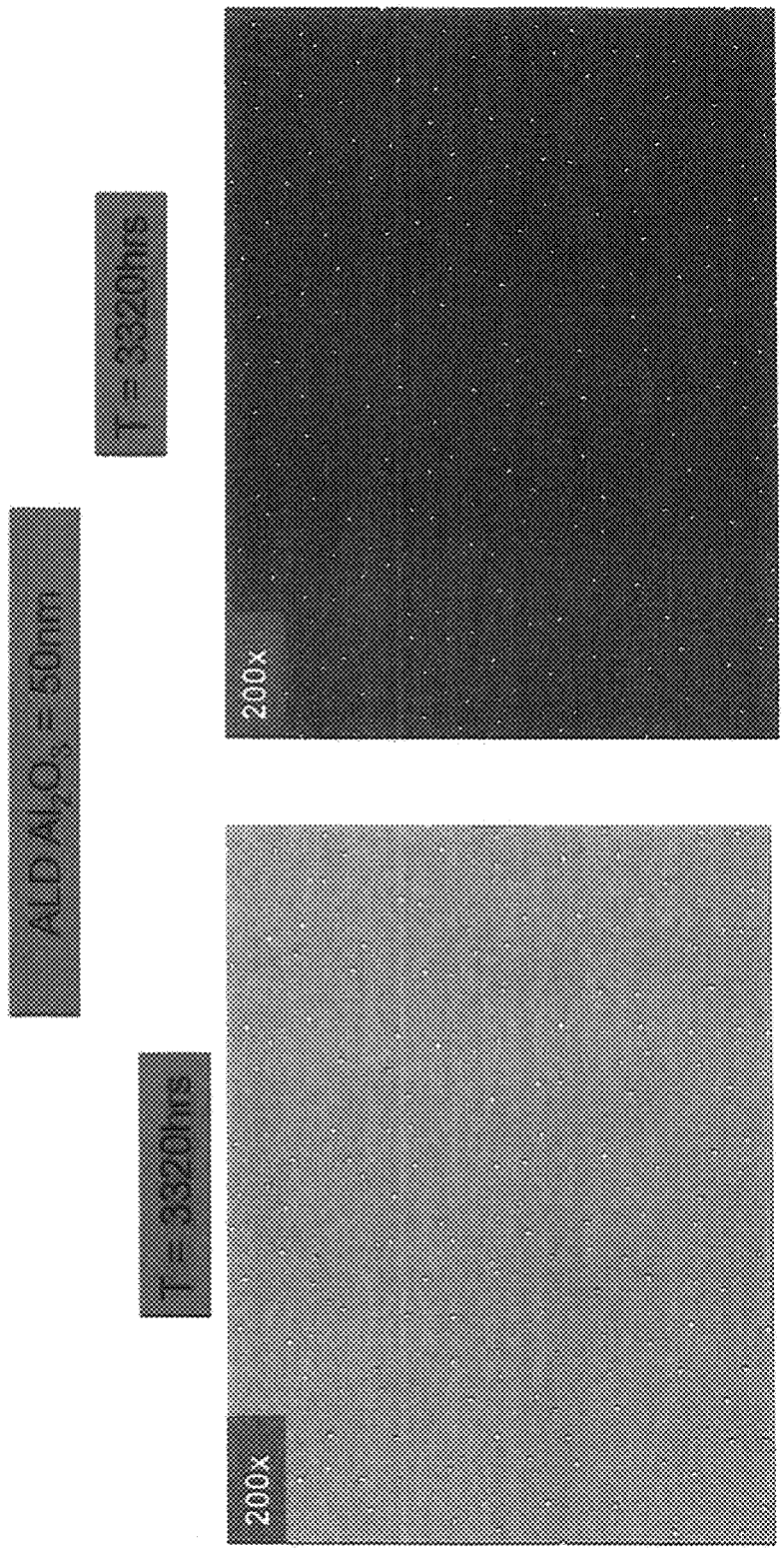

Testing results performed on Examples 1 through 4 and Comparative Examples 1 and 2 have shown that the two-layer barrier including a first barrier layer deposited by sputtering and a second barrier layer deposited by atomic layer deposition (Example 2) achieved a better water vapor transmission rate than the two-layer barrier including both layers deposited by sputtering. A first set of test slides labeled "Run #2 Ca Test: 1268 Traveler," shown in FIGS. 5B and 5C, depict the results for Comparative Example 1 (in which both layers are deposited by sputtering). A second set of test slides labeled "Run #1 Ca Test: 1078," shown in FIGS. 6A and 6B depict the results for Example 2 (in which the first barrier layer is deposited by sputtering and the second barrier layer is deposited by atomic layer deposition). The related calcium test procedures are described in Nisato, et al. "P-88: Thin Film Encapsulation for OLEDs: Evaluation of Multi-Layer Barriers using the Ca Test," *SID 03 Digest*, ISSN/0003-0966X/03/3401-0550, pg. 550-553 (2003)(describing the calcium test procedure) and Nisato, et al., "Evaluating High Performance Diffusion Barriers: the Calcium Test," *Proc. Asia Display*, IDW01, pg. 1435 (2001) (also describing the calcium test), the entire contents of all of which are incorporated herein by reference. The test procedures showed that the two-layer barrier coating, including a first barrier layer deposited by sputtering and a second barrier layer deposited by atomic layer deposition, achieves a water vapor transmission rate of about $10^{-6}$ gm/m$^2$·day to about $3.0 \times 10^{-7}$ gm/m$^2$·day, and does not have pinhole defects. This shows that the defects in the first barrier layer are corrected by the second barrier layer. In contrast, the two-layer barrier coating including both layers deposited by sputtering had pinhole surface defects, indicating that the defects in the first barrier layer are not corrected by the second sputtered barrier layer (although in its good area, it has a water vapor transmission rate on the order of $10^{-6}$ gm/m$^2$·day).

Figure 7A:
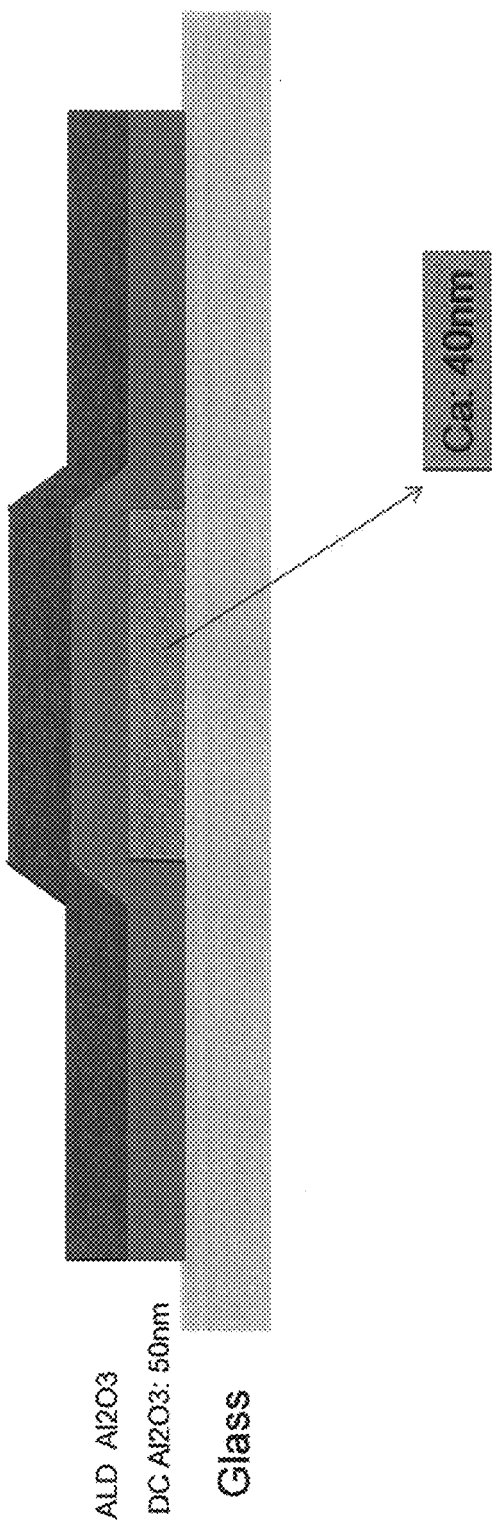
FIG. 7A illustrates a Dyad calcium test sample structure used in the aging tests shown in FIGS. 7B-7D. (1 dyad refers to a structure of one layer of polymer and one layer of inorganic layer on top.)
Figure 7B:
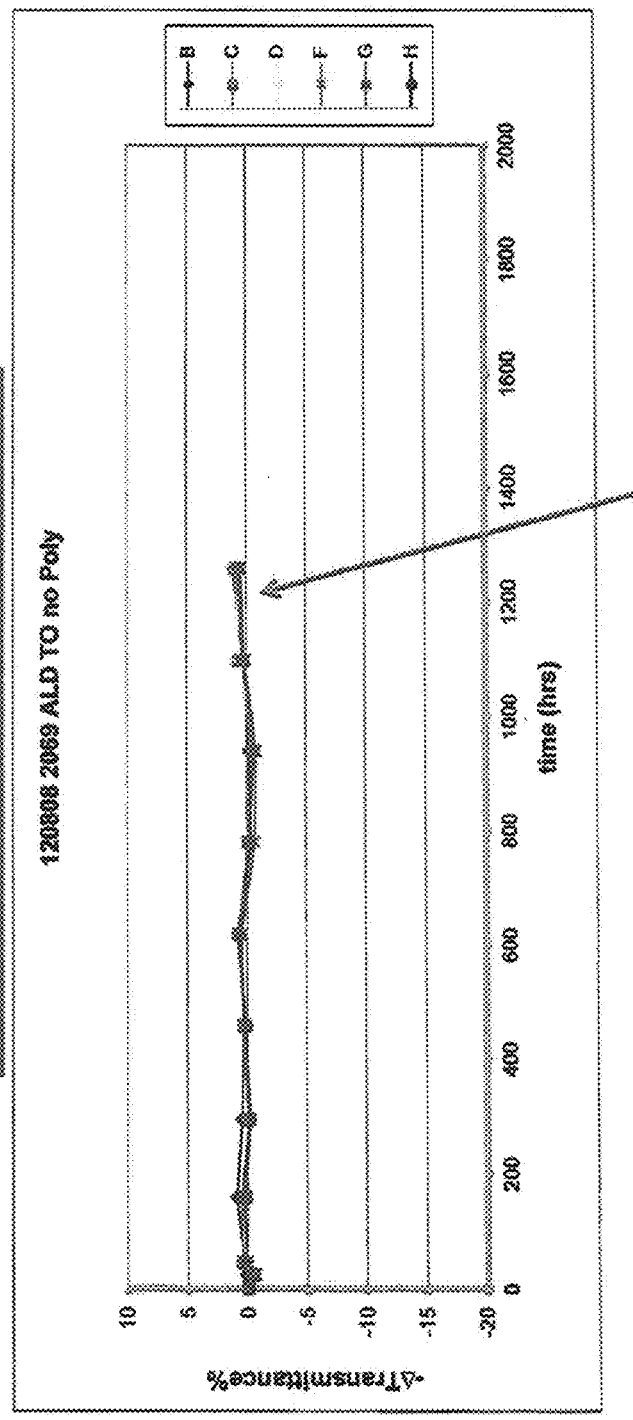
Figure 7C:
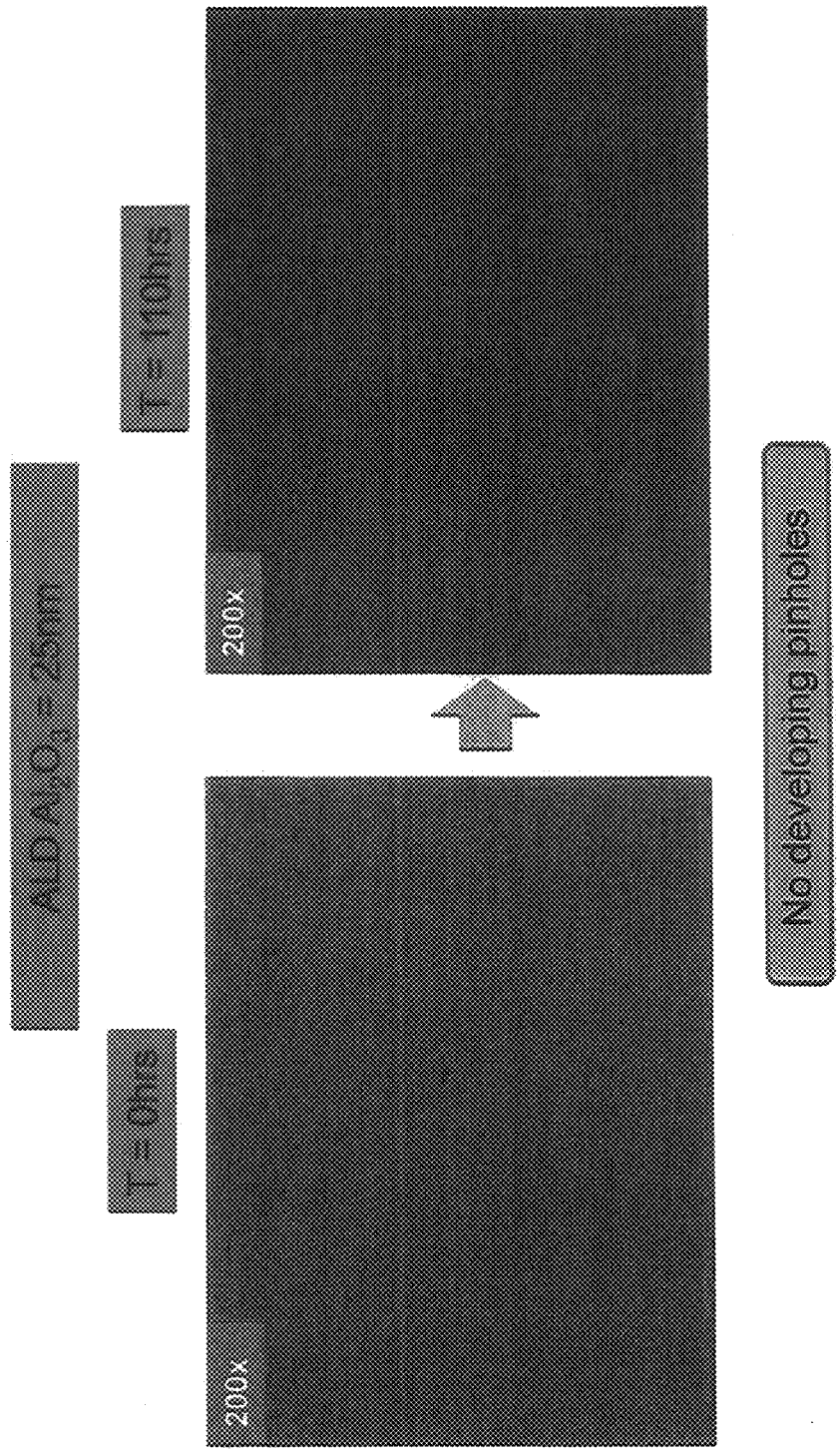
FIG. 7C is a set of test slides showing the results of the aging tests for an atomic layer deposition barrier.

FIGS. 7A-7D show a test sample structure and the results of aging test data for selected ALD test samples. The barrier layers were coated on glass and/or polymer substrates and 25 nm outer ALD layers were tested for stability levels over time. FIG. 7B shows aging test results for one test sample at room temperature. FIG. 7C shows a set of test slides for the same aging test. Generally, all test samples from the aging tests showed no degradation of the ALD layer at 600 hours in room temperature tests, along with water vapor transmission rates on the order of $10^{-6}$ gm/m$^2$·day. FIG. 7D shows a comparison of room temperature and 40° C. temperature aging test results in one test where the ALD layer exhibited good stability over 600 hours.

Further test data show that the two-layer barriers of Examples 1, 3 and 4 are stable even after standing for extended periods of time, according to TEM, RBS and XPS analysis of Examples 5, 6 and 7, and Comparative Example 3.

TEM analysis was carried out on the following test samples shown in FIGS. 8A-8D:

|  | 8A | 8B | 8C | 8D |
|---|---|---|---|---|
| ALD Al$_2$O$_3$ | 47 nm | 23 nm | 23 nm | 45 nm |
| Sputtered Al$_2$O$_3$ | 41 nm | 40 nm | 42 nm | — |
| Substrate | PEN | PEN | PEN | Si |

Figure 8A:
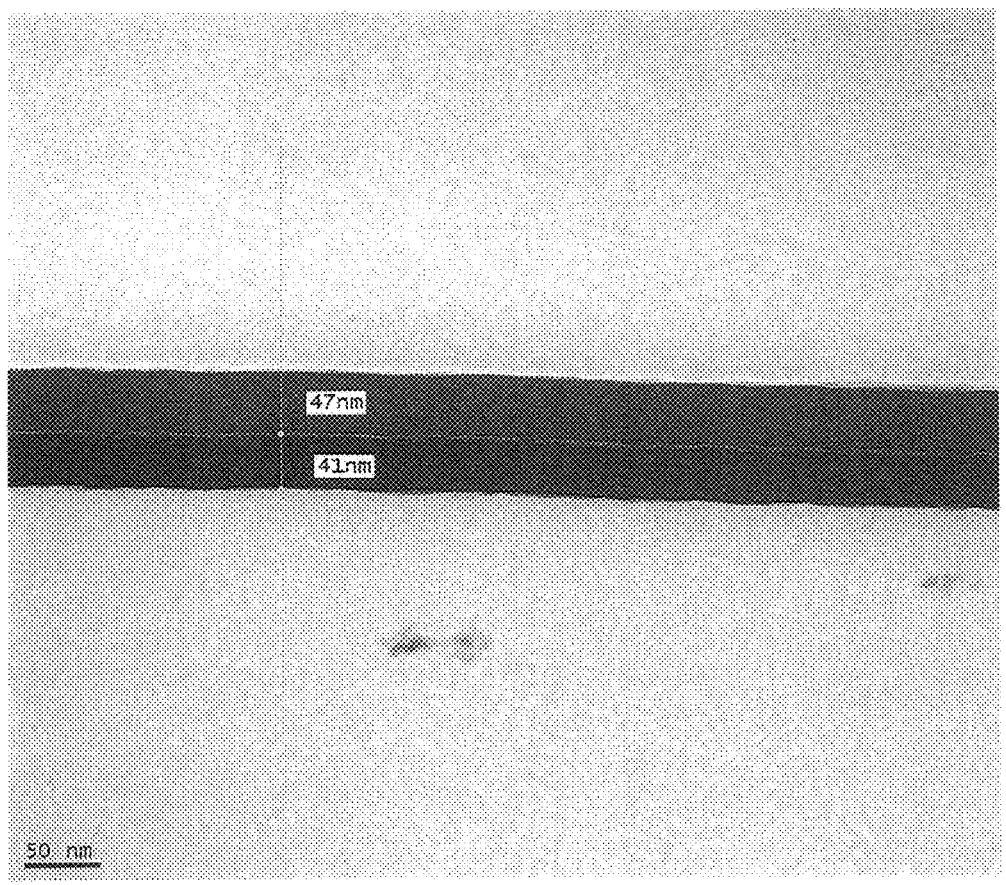
FIGS. 8A to 8G show TEM, RBS and XPS analysis of atomic layer deposition test samples tested for their uniformity and levels of carbon impurities.
Figure 8B:
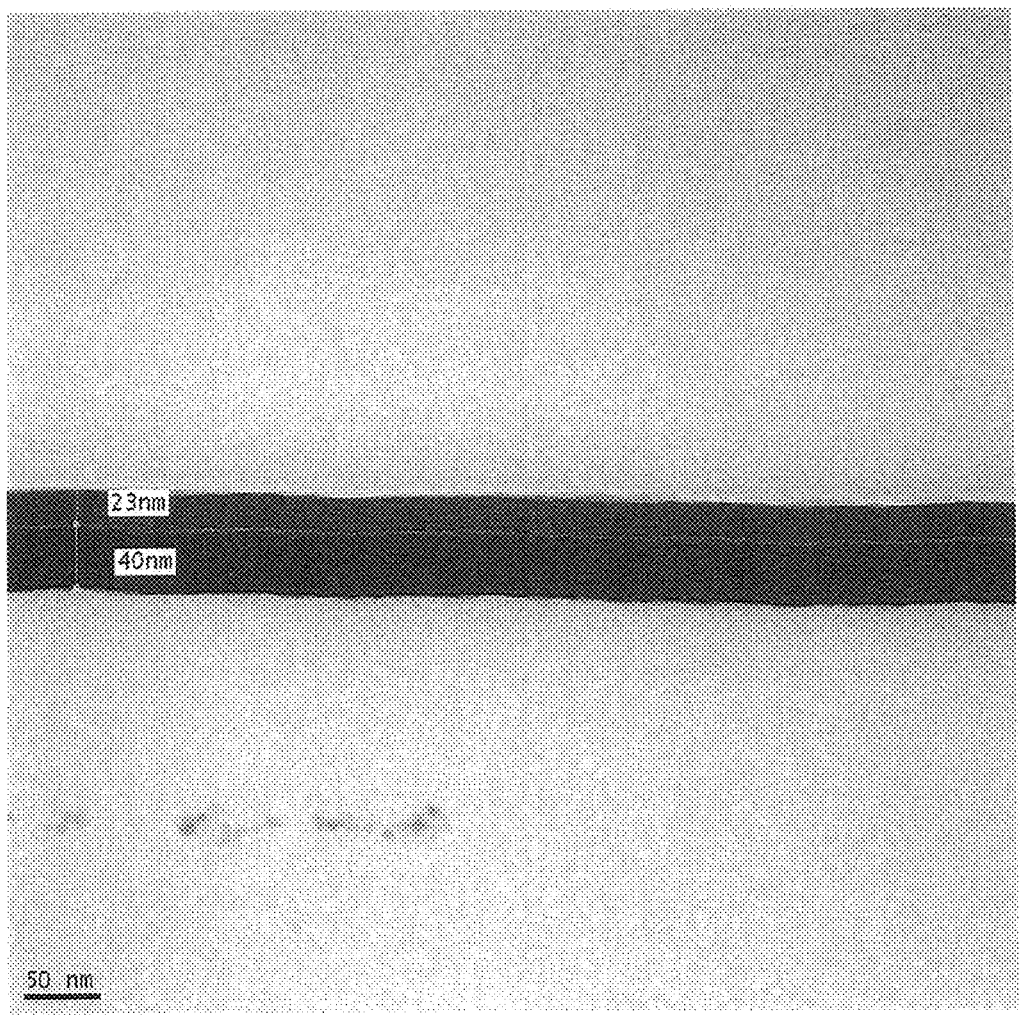
Figure 8C:
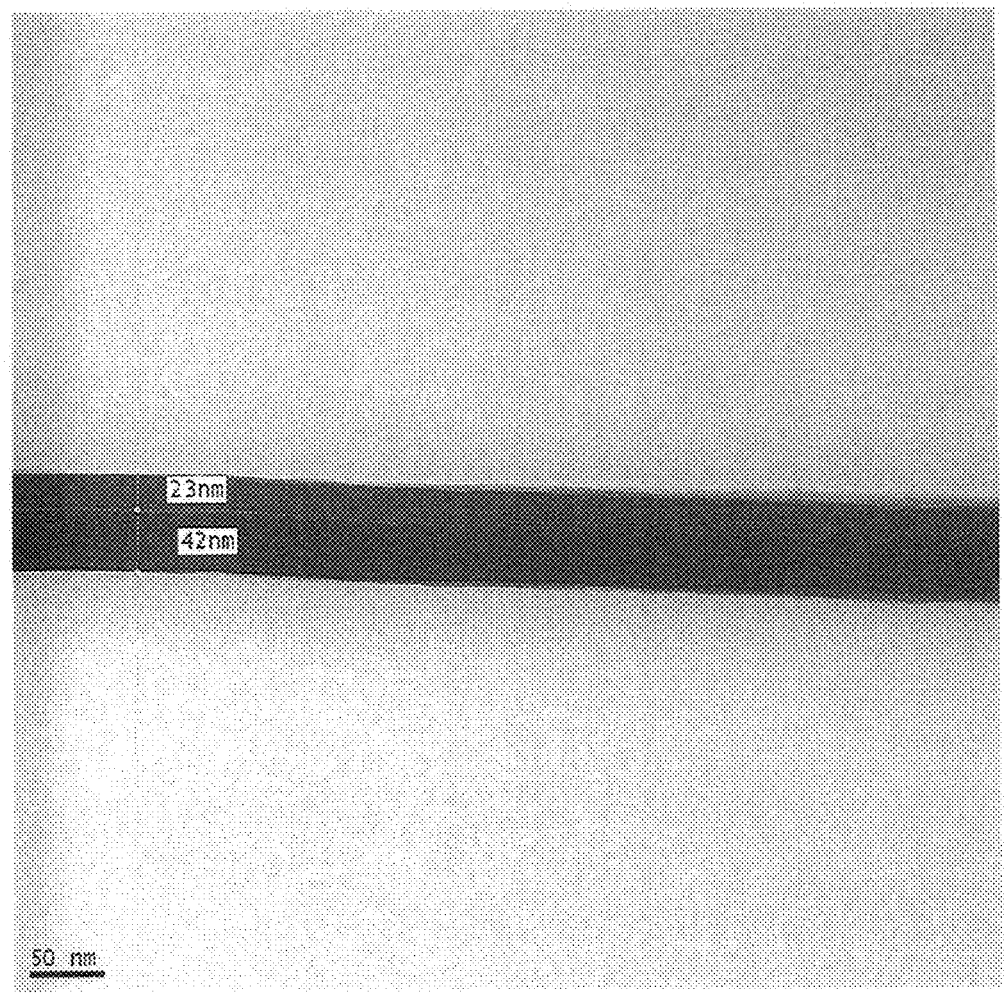
Figure 8D:
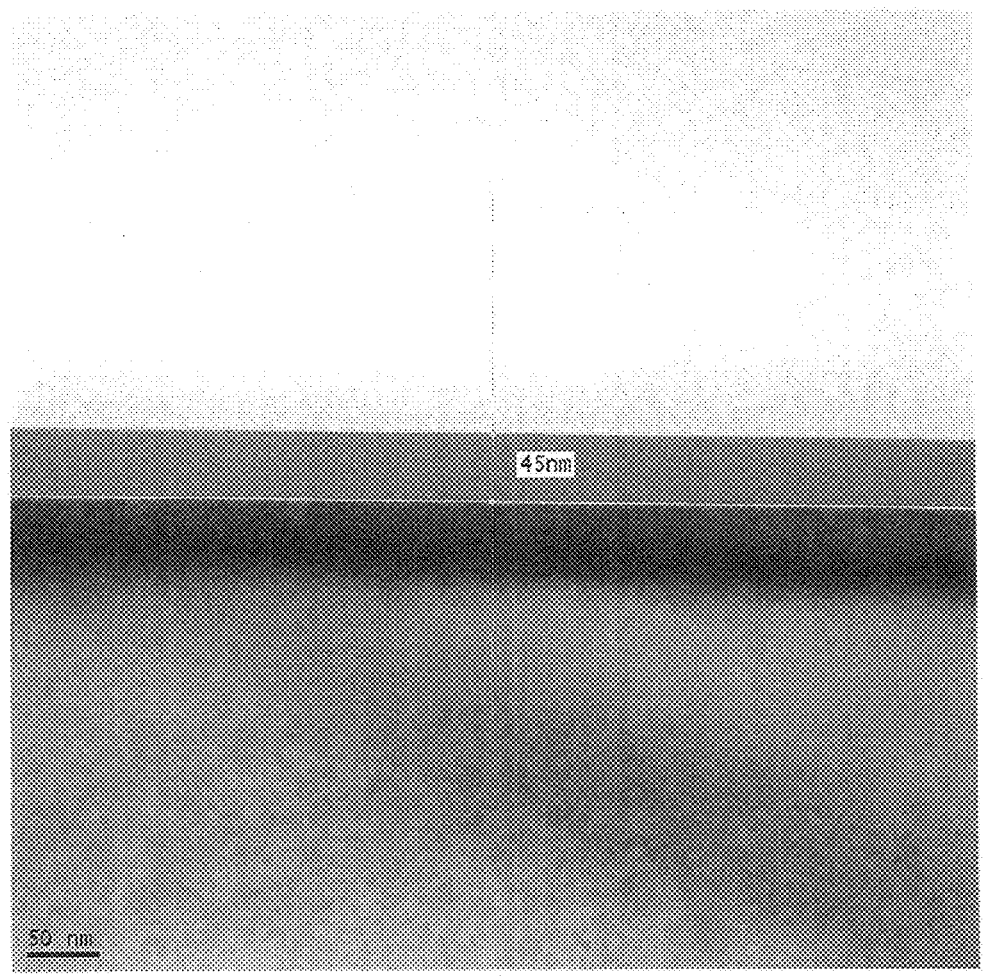
Figure 8E:
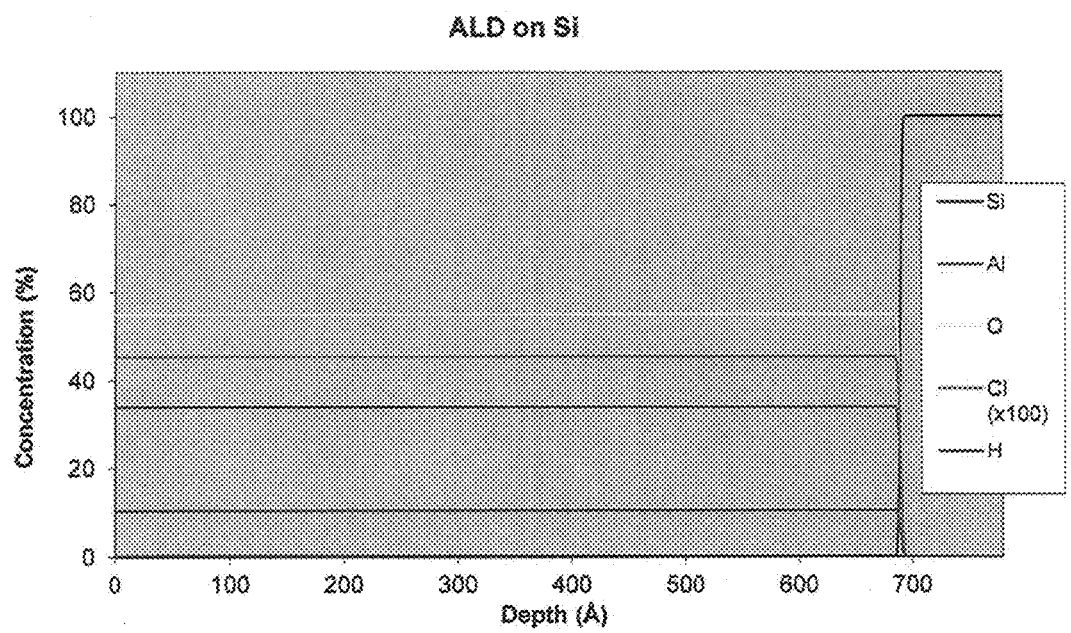
Figure 8F:
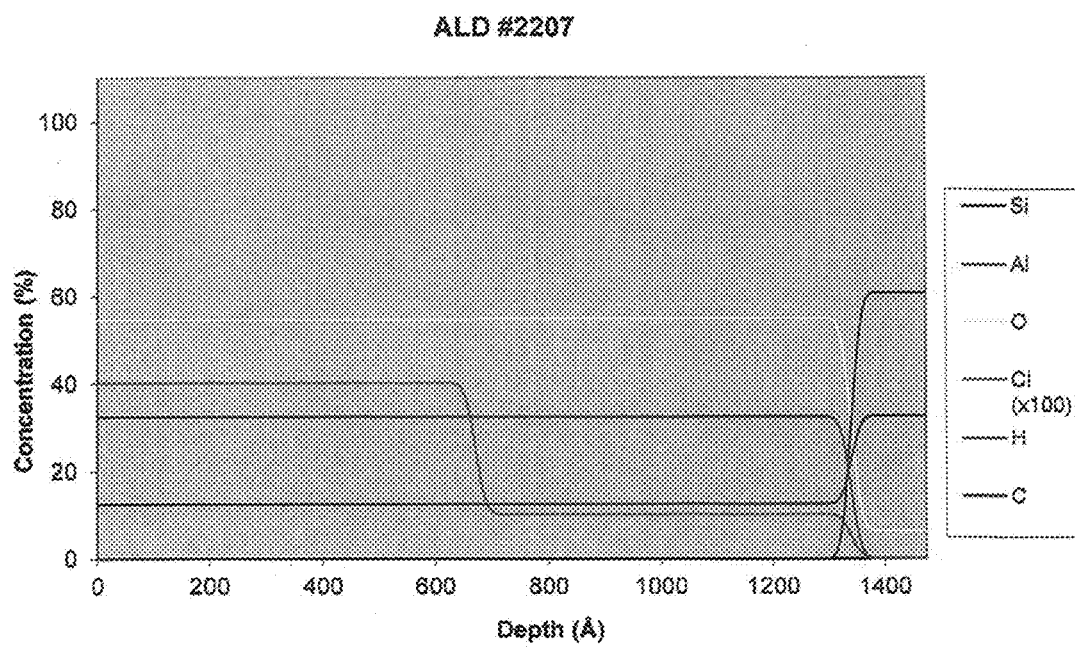
Figure 8G:
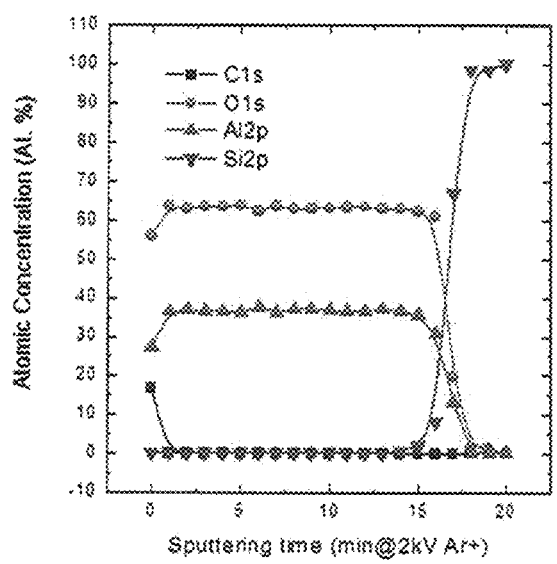

The test results demonstrated that the second barrier layer on the first layer has a uniform, amorphous structure, and that the level of carbon impurities (e.g., from unreacted ALD precursor materials) is below the detection limit. FIGS. 8E and 8F show an example of RBS analysis for two of these ALD test samples. FIG. 8G shows an example of XPS analysis for the ALD layer on the silicon wafer sample.

EXAMPLE 8

A sputtered barrier layer, according to the invention, was experimentally tested to demonstrate the quality of its barrier properties, as indicated by the following water vapor transmission rate (WVTR) tests.

The sputtered barrier layer (Al$_2$O$_3$) was tested at 100 nm thickness, and yielded a measured WVTR of less than $5 \times 10^{-5}$ gm/m$^2$·day, with an optical transmission rate (OTR) of about 0.01 cc/m$^2$/day at 20° C./50% RH (relative humidity) on large size (4"×4") substrates.

The sputtered barrier layer was also tested at 100 nm thickness according to the Mocon Aquatran-2 test procedures. The barrier layer was tested on a smoothing layer applied to a polymeric (PEN) substrate. WTR measured $7.56 \times 10^{-5}$ gm/m$^2$·day at 40° C./90% RH, equivalent to $7.56 \times 10^{-6}$ gm/m$^2$·day at 20° C./50% RH. Without a smoothing layer, the 100 nm (Al$_2$O$_3$) barrier layer had a measured WVTR of $4.65 \times 10^{-5}$ gm/m$^2$·day at 20° C./100% RH, equivalent to $2.3 \times 10^{-5}$ gm/m$^2$·day at 20° C./50% RH, according to the HTO test procedures.

EXAMPLE 9

Due to the initial nucleation property in film deposition, the film structure and morphology changes with film thickness, and so the barrier property changes with film thickness. Below a certain film thickness, the WVTR increases rapidly with decreasing thickness; while above that thickness, the WVTR remains more or less flat with increasing thickness. The relationship between WVTR and film thickness (called the "knee curve" of WVTR) was studied for sputtered Al$_2$O$_3$ on PEN substrates. As shown in the graph of FIG. 9, the critical thickness is about 20 nm. In the graph the color coded horizontal lines represent the detection limit of the instruments used to measure WVTR in the specific range.

EXAMPLE 10

The purity of ALD precursors can affect barrier performance, and higher purity precursors produce less impurity in the ALD films. In one experiment, two types of TMA with different grades (high purity grade vs. electronic purity grade) were used in an ALD film deposition test. RBS analysis showed that the films have very different levels of chlorine impurity: The film from high purity grade TMA contains 0.5% chlorine atoms impurity, while the ALD film from electronic purity grade TMA contains only 10 ppm chlorine.

While certain exemplary embodiments of the present invention have been illustrated and described, it is understood by those of ordinary skill in the art that certain modifications and changes can be made to the described embodiments without departing from the spirit and scope of the present invention.

What is claimed is:

1. A composite article comprising:
    a substrate; and
    a barrier stack for protecting a surface of the substrate, the barrier stack comprising:
        a first barrier layer on the surface of the substrate, the first barrier layer being a sputtered barrier layer and comprising aluminum oxide, and
        a second barrier layer on a surface of the first barrier layer, the second barrier layer being an atomic layer-deposited barrier layer,
    the first barrier layer being between the substrate and the second barrier layer,
    wherein the first barrier layer, in the absence of the second barrier layer, has a water vapor transmission rate of about $10^{-5}$ gm/m$^2$·day or lower, and
    wherein the barrier stack has a water vapor transmission rate of about $10^{-6}$ gm/m$^2$·day or lower.

2. The article according to claim 1, wherein the second barrier layer is sufficiently thick to correct physical defects present on the exposed surface of the first barrier layer, but thin enough to flex without cracking.

3. The article according to claim 1, wherein the second barrier layer is thinner than the first barrier layer.

4. The article according to claim 1, wherein the substrate comprises an organic light-emitting device.

5. The article according to claim 1, wherein the composite article comprises a laminate film.

6. The article according to claim 1, wherein the first barrier layer comprises at least one of (b) and (c):
    (b) a layer thickness from about 20 to about 100 nm;
    (c) a refractive index of about 1.6 or greater.

7. The article according to claim 1, further comprising a planarization layer on the substrate between the substrate and the first barrier layer.

8. The article according to claim 7, further including a tie layer on the substrate between the substrate and the planarization layer.

9. The article according to claim 8, wherein the first and second barrier layers each comprise a monolayer, and the barrier stack forms the outer surface of the article.

10. A method for protecting a substrate from the permeation of moisture and gases, the method comprising:
    sputtering a first barrier layer on a substrate, wherein the sputtered first barrier layer has a water vapor transmission rate of about $10^{-5}$ gm/m$^2$·day or lower and comprises aluminum oxide, and
    depositing a second barrier layer on the first barrier layer by atomic layer deposition, to form a barrier stack having a water vapor transmission rate of about $10^{-6}$ gm/m$^2$·day or lower.

11. The method according to claim 10, wherein the second barrier layer is sufficiently thick to correct physical defects present on the surface of the first barrier layer but thin enough to flex without cracking.

12. The method according to claim 10, wherein the second barrier layer is thinner than the first barrier layer.

13. The method according to claim 10, wherein the first barrier layer comprises at least one of (b) and (c):
    (b) a layer thickness from about 20 to about 100 nm;
    (c) a refractive index of about 1.6 or greater.

14. The method according to claim 10, further comprising depositing a planarization layer between the first barrier layer and the substrate.

15. The method according to claim 14, further comprising depositing a tie layer between the planarization layer and the substrate.

16. The method according to claim 11, wherein the substrate comprises an organic light emitting device.

17. The method according to claim 16, wherein the first and second barrier layers each comprise a single layer, and the barrier stack forms an outer surface of the article.

18. The method according to claim 10, wherein the sputtering of the first barrier layer comprises AC sputtering or pulsed DC sputtering.

19. A composite article comprising:
a substrate; and
a two-layer barrier stack for protecting a surface of the substrate, the barrier stack comprising:
a bottom barrier layer on the surface of the substrate, the bottom barrier layer being a sputtered barrier layer having a water vapor transmission rate of about $10^{-5}$ gm/m²·day or lower and comprising aluminum oxide, and
a top barrier layer on a surface of the bottom barrier layer, the top barrier layer being an atomic layer-deposited barrier layer, wherein the two-layer barrier stack has a water vapor transmission rate of about $10^{-6}$ gm/m²·day or lower,
wherein the bottom barrier layer has a film thickness of at least about 20 nm.

20. The article according to claim 19, wherein the composite article comprises a laminate film.

21. The article according to claim 19, wherein the substrate comprises an organic light-emitting device.

22. The article according to claim 19, wherein the bottom and top barrier layers each comprise a single layer, and the barrier stack forms the outer surface of the article.

23. The article according to claim 20, wherein the bottom barrier layer is formed by AC sputtering or pulsed DC sputtering.

24. The article according to claim 20, wherein the top barrier layer comprises aluminum oxide.

* * * * *